(12) United States Patent
Mikkelsen et al.

(10) Patent No.: US 10,416,385 B1
(45) Date of Patent: Sep. 17, 2019

(54) NEGATIVE ANGLE GRATING COUPLER

(71) Applicants: Finisar Corporation, Sunnyvale, CA (US); The Governing Council of the University of Toronto, Toronto, Ontario (CA)

(72) Inventors: Jared Carl Mikkelsen, Oakville (CA); Joyce Kai See Poon, Toronto (CA); Daniel Mahgerefteh, Los Angeles, CA (US)

(73) Assignees: FINISAR CORPORATION, Sunnyvale, CA (US); THE GOVERNING COUNCIL OF THE UNIVERSITY OF TORONTO, Toronto, Ontario (CA)

( * ) Notice: Subject to any disclaimer, the term of this patent is extended or adjusted under 35 U.S.C. 154(b) by 0 days.

(21) Appl. No.: 15/977,907

(22) Filed: May 11, 2018

(51) Int. Cl.
| | |
|---|---|
| *G02B 6/12* | (2006.01) |
| *G02B 6/124* | (2006.01) |
| *H01S 5/00* | (2006.01) |
| *G02B 6/34* | (2006.01) |
| *H01S 5/40* | (2006.01) |
| *G02B 6/02* | (2006.01) |

(52) U.S. Cl.
CPC ......... *G02B 6/124* (2013.01); *G02B 6/02085* (2013.01); *G02B 6/12004* (2013.01); *G02B 6/34* (2013.01); *H01S 5/0064* (2013.01); *H01S 5/4031* (2013.01); *G02B 2006/12061* (2013.01); *G02B 2006/12121* (2013.01); *G02B 2006/12147* (2013.01)

(58) Field of Classification Search
CPC ................ G02B 6/124; G02B 6/02085; G02B 6/12004; G02B 6/34; G02B 2006/12061; G02B 2006/12121; G02B 2006/12147; H01S 5/0064; H01S 5/4031
USPC .......................................................... 385/37
See application file for complete search history.

(56) References Cited

U.S. PATENT DOCUMENTS

| | | | |
|---|---|---|---|
| 6,118,915 | A | 9/2000 | Sato |
| 6,282,219 | B1 | 8/2001 | Butler et al. |
| 8,267,583 | B2 | 9/2012 | Yao et al. |
| 8,503,841 | B2 | 8/2013 | Kopp et al. |
| 8,660,391 | B1 | 2/2014 | Fish |
| 9,715,064 | B1 | 7/2017 | Gambino et al. |
| 2002/0176463 | A1 | 11/2002 | Bullington et al. |
| 2005/0147355 | A1 | 7/2005 | Ilchenko |

(Continued)

FOREIGN PATENT DOCUMENTS

WO    WO2017/106880 A1    6/2017

OTHER PUBLICATIONS

International Search Report and Written Opinion dated Mar. 20, 2017, in related PCT Application No. PCT/US2016/067634 (16 pgs).

(Continued)

*Primary Examiner* — Jerry M Blevins
(74) *Attorney, Agent, or Firm* — Maschoff Brennan

(57) ABSTRACT

In an example, a system includes a grating coupled laser and a photonic integrated circuit. The grating coupled laser includes a first waveguide and a transmit grating coupler optically coupled to the first waveguide. The photonic integrated circuit includes a second waveguide and a receive grating coupler optically coupled to the second waveguide. The second grating coupler may include a negative angle grating coupler.

20 Claims, 4 Drawing Sheets

(56) References Cited

U.S. PATENT DOCUMENTS

| | | | |
|---|---|---|---|
| 2007/0279634 A1* | 12/2007 | Gruhlke | G01N 21/553 356/445 |
| 2009/0003762 A1 | 1/2009 | Chiniwalla et al. | |
| 2010/0006784 A1 | 1/2010 | Mack et al. | |
| 2012/0201491 A1 | 8/2012 | Zhou | |
| 2012/0328234 A1 | 12/2012 | Lu et al. | |
| 2013/0259077 A1 | 10/2013 | Bakir et al. | |
| 2015/0177459 A1 | 6/2015 | Van Campenhout et al. | |
| 2015/0260913 A1 | 9/2015 | Li et al. | |
| 2015/0260994 A1* | 9/2015 | Akutsu | G02B 6/34 359/567 |
| 2015/0286008 A1 | 10/2015 | Shimizu et al. | |
| 2016/0238793 A1 | 8/2016 | Frankel et al. | |
| 2016/0246009 A1 | 8/2016 | Jiang | |
| 2016/0356956 A1* | 12/2016 | Davoine | G01N 21/7743 |
| 2017/0179680 A1* | 6/2017 | Mahgerefteh | G02B 6/12004 |
| 2017/0207600 A1 | 7/2017 | Klamkin et al. | |

OTHER PUBLICATIONS

International Search Report and Written Opinion dated Jul. 12, 2019, in related PCT Application No. PCT/US2019/031181.

* cited by examiner

NEGATIVE ANGLE GRATING COUPLER

FIELD

The embodiments discussed herein are related to a negative angle grating coupler.

BACKGROUND

Unless otherwise indicated herein, the materials described herein are not prior art to the claims in the present application and are not admitted to be prior art by inclusion in this section.

Coupling light from single mode edge emitting lasers to silicon (Si) photonics is costly, as it generally requires two lenses and a large isolator block. In systems that include such lasers and Si photonics, alignment tolerances may be less than 0.5 micrometers (μm). Such low alignment tolerances typically require active alignment to be met.

The subject matter claimed herein is not limited to implementations that solve any disadvantages or that operate only in environments such as those described above. Rather, this background is only provided to illustrate one example technology area where some implementations described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to negative angle grating couplers.

In an example embodiment, a system includes a grating coupled laser and a photonic integrated circuit. The grating coupled laser includes a first waveguide and a transmit grating coupler optically coupled to the first waveguide. The photonic integrated circuit includes a second waveguide and a receive grating coupler optically coupled to the second waveguide. The second grating coupler may include a negative angle grating coupler.

In another example embodiment, a system includes a grating coupled laser and a photonic integrated circuit. The grating coupled laser includes a first waveguide and a transmit grating coupler optically coupled to the first waveguide. The photonic integrated circuit includes a second waveguide and a receive grating coupler optically coupled to the second waveguide. The receive grating coupler of the photonic integrated circuit is optically coupled to the transmit grating coupler of the grating coupled laser. A first electric field radiation profile of the transmit grating coupler and a second electric field radiation profile of the receiver grating coupler are both generally exponential and in a same direction.

In another example embodiment, a photonic integrated circuit includes a waveguide, a receive grating coupler, and a top cladding. The receive grating coupler is optically coupled to the waveguide. The receive grating coupler includes a partial etch slab optically coupled with the waveguide and grating teeth that extend from the partial etch slab. The top cladding covers the waveguide and the receive grating coupler and fills in gaps between the grating teeth. The receive grating coupler includes a negative angle grating coupler in which incident light on the receive grating coupler that has a lateral component parallel to the waveguide is coupled into the waveguide to propagate in the waveguide in a direction that is opposite the lateral component.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1A:
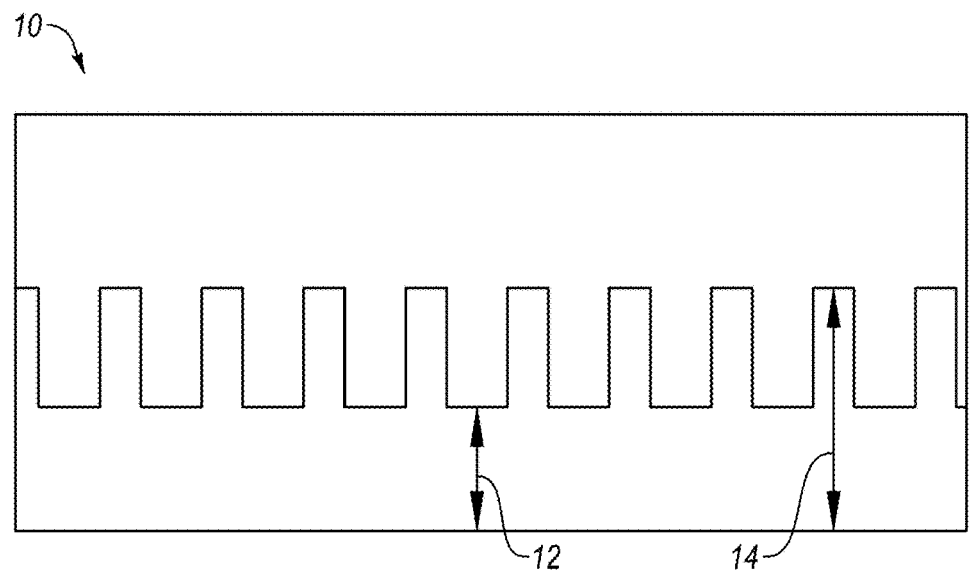
FIG. 1A illustrates an example grating coupler.

U.S. Publication No. 2017/0179680, published Jun. 22, 2017 (hereinafter the '680 publication) is incorporated herein by reference. Some embodiments described herein and/or in the '680 publication remove the need for lenses in systems such as those described in the BACKGROUND, which may reduce part count and cost, and significantly simplify packaging processes in such systems. An isolator may be used in some embodiments of such systems, or an isolator may be omitted from some embodiments of such systems. The absence of lenses in such systems may significantly reduce the size and cost of the isolator (when included) and may significantly increase alignment tolerances. For example, the alignment tolerance may be increased by a factor of 10 or even 50 or more from about 0.1 μm which has to be done by active feed-back alignment, which requires turning on the laser during alignment, to about 1-2 μm or even 5-8 μm or more achieved in a passive alignment pick-and place machine; i.e. without having to turn on the laser. Alternatively or additionally, embodiments described herein may enable wafer level testing of lasers.

According to some embodiments, a surface coupled system including a transmit grating coupler and a receive grating coupler is provided to couple light from an edge emitting laser to a PIC, such as a Si PIC. In some embodiments, the transmit and receive grating couplers may each include a small index contrast long surface grating. In general, a small index contrast long surface grating may include a surface grating with an index contrast less than about 1-1.5 and a length greater than 10 μm. In other embodiments, the transmit and receive grating couplers may each include a large area surface grating (LASG) with a length greater than about 10 μm and with or without small index contrast.

The edge emitting laser may include an indium phosphide (InP) laser or other suitable edge emitting laser. The InP laser may include an input passive waveguide, also referred to as a first waveguide, that expands in a fan out region to the transmit grating coupler. The transmit grating coupler may be configured to generate a relatively large optical mode spot size of about 8-40 μm for an optical beam diffracted by the transmit grating coupler. Such an edge emitting laser formed in the same chip with a transmit grating may be referred to herein as a grating coupled laser. As used herein, "transmit grating coupler" may generally refer to a diffraction grating included in a passive section of a grating coupled laser which diffracts light from a laser cavity of the grating coupled laser downward through a substrate and/or other layers towards the Si PIC.

The first waveguide of the grating coupled laser may include a core with a core index of refraction, a top cladding with a top cladding index of refraction, and a substrate as a bottom cladding with a bottom cladding index of refraction. The transmit grating coupler may include grating teeth formed on the core of the first waveguide, the grating teeth may each have a total height, a height above the core of the first waveguide, a period, and a duty cycle. In some embodiments, the core index of refraction may be greater than a first threshold value so that an effective index of the first diffraction grating is sufficiently higher than the bottom cladding index to avoid leakage of a diffracted optical mode into the substrate.

The receive grating coupler may be formed in the Si PIC. The receive grating coupler may be configured to receive the optical beam diffracted by the transmit grating coupler and to redirect the optical beam into a waveguide of the Si PIC, which waveguide may be referred to as a second waveguide to distinguish it from the first waveguide of the grating coupled laser. As used herein, "receive grating coupler" may generally refer to a diffraction grating included in the Si PIC which receives the light from the transmit grating coupler and directs it into the second waveguide in the Si PIC.

According to some embodiments described herein, the receive grating coupler may include a negative angle grating coupler. In general, a negative angle grating coupler may include a grating coupler in which a light propagation direction of incident light incident on the negative angle grating coupler has a lateral component in an opposite direction as light propagation in the second waveguide. The negative angle grating coupler implemented as the receive grating coupler as described herein may reduce coupling loss between the transmit grating coupler and the receive grating coupler by half compared to some other embodiments, such as those described in the '907 application.

The negative angle grating coupler may include a silicon nitride (SiN) grating coupler, e.g., formed in the Si PIC, with alternating receive grating teeth and top cladding teeth with a constant receive grating period in a range of 400 to 700 nanometers (nm). For example, the constant receive grating period may be 508.4 nm. The receive grating teeth may have a receive grating duty cycle in a range of 0.2 to 0.9. For example, the receive grating duty cycle may be 0.6439.

Alternatively, the negative angle grating coupler may include a Si grating coupler, e.g., formed in the Si PIC<with alternating receive grating teeth and top cladding teeth with a constant receive grating period in a range of 200-400 nm. For example, the constant receive grating period may be about 300 nm. The receive grating teeth may have a receive grating duty cycle in a range of 0.4 to 0.8. For example, the receive grating duty cycle may be 0.6439.

The transmit grating coupler may include alternating transmit grating teeth and top cladding teeth with a constant transmit grating period in a range of 400 to 700 nm. For example, the constant transmit grating period may be 543.6 nm. The transmit grating teeth may have a transmit grating duty cycle in a range of 0.20 to 0.9. For example, the transmit grating duty cycle may be 0.3505. In these and other embodiments, the transmit grating teeth may have a total tooth height from a bottom of a core of the first waveguide on which the transmit grating teeth are formed to a top of the transmit grating teeth. The total tooth height of the transmit grating teeth may be in a range from 600 to 700 nm. For example, the total tooth height of the transmit grating teeth may be 679.5 nm.

In some embodiments, the surface coupled system may further include an antireflection (AR) layer and/or an optical isolator optically positioned between the transmit grating coupler and the receive grating coupler. The AR layer may be formed on the receive grating coupler or at another location between the transmit grating coupler and the receive grating coupler.

Alternatively or additionally, the receive grating coupler may have a partial etch slab thickness in a range of 240 to 350 nm. The partial etch slab thickness refers to a height or thickness of the core material from a bottom of the core material to a bottom of the grating teeth formed thereon, which may be less than the total tooth height from the bottom of the core material to the top of the grating teeth formed on the core material. The partial etch slab thickness may be 256.5 nm.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Partial etch slab thickness and total tooth height are depicted in FIG. 1A, which illustrates an example grating coupler 10, arranged in accordance with at least one embodiment described herein. The grating coupler 10 may be implemented as a transmit grating coupler or a receive grating coupler. The partial etch slab thickness is depicted in FIG. 1A at 12. The total tooth height is depicted in FIG. 1A at 14.

Figure 1B:
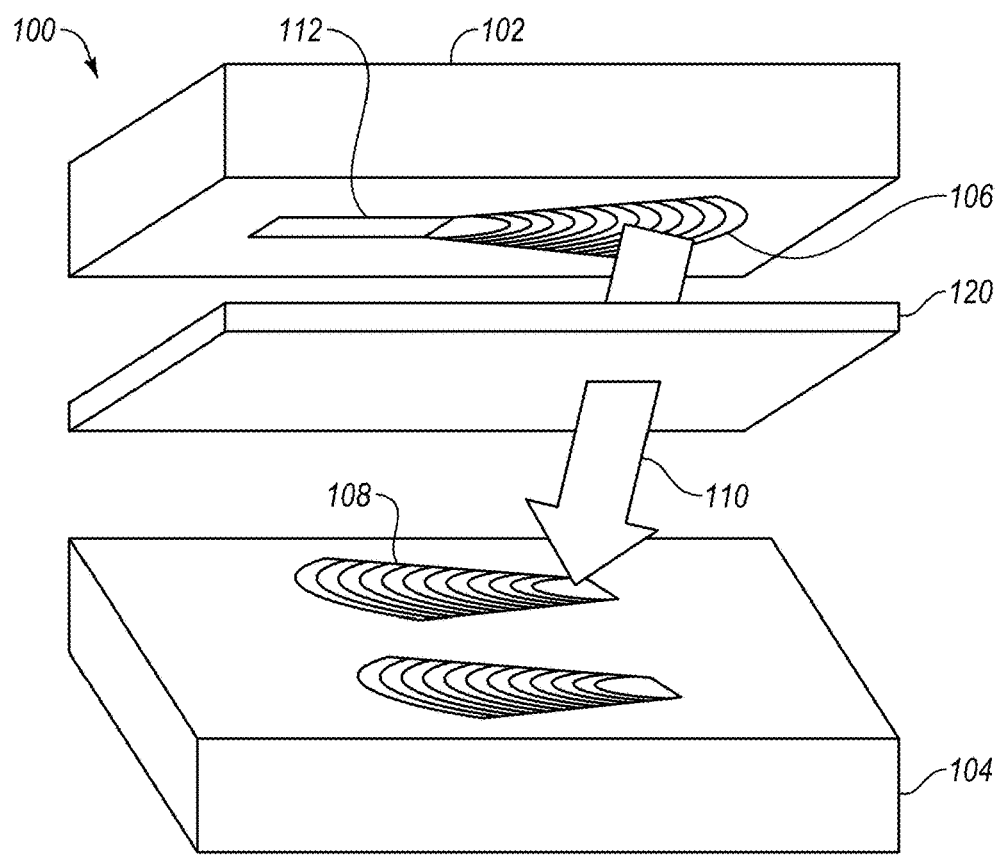
FIG. 1B illustrates an example surface coupled system.

FIG. 1B illustrates an example surface coupled system 100, arranged in accordance with at least one embodiment described herein. As illustrated, the surface coupled system 100 may include a grating coupled laser (GCL or "GCL laser") 102 and a PIC 104. In the example of FIG. 1, the GCL laser 102 may include an InP laser and the PIC 104 may include a Si PIC. The surface coupled system 100 of FIG. 1B may additionally include an optical isolator 120 (hereinafter "isolator 120") disposed between the GCL laser 102 and the Si PIC 104. In other embodiments, the isolator 120 may be omitted from this and other surface coupled systems.

The GCL laser 102 may include a transmit grating coupler 106 and the PIC 104 may include a receive grating coupler 108. The transmit grating coupler 106 may be optically coupled to an active section 112 of the GCL laser 102 through a core waveguide. The core waveguide may be optically coupled to receive light emitted by a gain medium of the active section 112 of the GCL laser 102. In some embodiments, a fan out region may be provided between the core waveguide and the transmit grating coupler 106 and/or may include the core waveguide. The fan out region may be formed from a same medium and layer as the core waveguide such that the fan out region may generally be an extension of the core waveguide. Additionally, the fan out region may include grating lines such that the fan out region may generally be an extension of the transmit grating coupler 106.

The light emitted from the active section 112 of the GCL laser 102 may travel through the core waveguide to the fan out region, where a mode of the light may be expanded laterally (e.g., generally in and out of the page in FIG. 1B). The transmit grating coupler 106 may diffract the light with the laterally expanded mode generally downward as diffracted light 110. The diffracted light 110 may be diffracted toward the receive grating coupler 108 of the PIC 104. The mode of the diffracted light 110 may be expanded to a 8-40 µm spot size (lateral measurement) within the fan out region while simultaneously being expanded along the direction of the active section 112 by the transmit grating coupler 106. One potential benefit of this method of expanding diffracted light may be that the spot size may be much larger than the 2 to 4 µm spot size that can be achieved with standard spot size converters.

The diffracted light 110 may be received by the receive grating coupler 108. The diffracted light 110 may be redirected by the receive grating coupler 108 into a waveguide (not illustrated) of the PIC 104. One example of the waveguide of the PIC 104 may be a Si waveguide.

The diffracted light 110 passes through the optical isolator 120 before reaching the receive grating coupler 108 of the PIC 104. The optical isolator 120 may be configured to reduce or eliminate back reflection. The optical isolator 120 may be attached to the PIC 104, or to the GCL laser 102, or to both the PIC 104 and the GCL laser 102, or to some other component(s).

One or both of the transmit grating coupler 106 and the receive grating coupler 108 may be implemented in the same or similar manner as the grating coupler 10 of FIG. 1A. Additionally, the receive grating coupler 108 may include a negative angle grating coupler as described in more detail below.

Figure 2A:
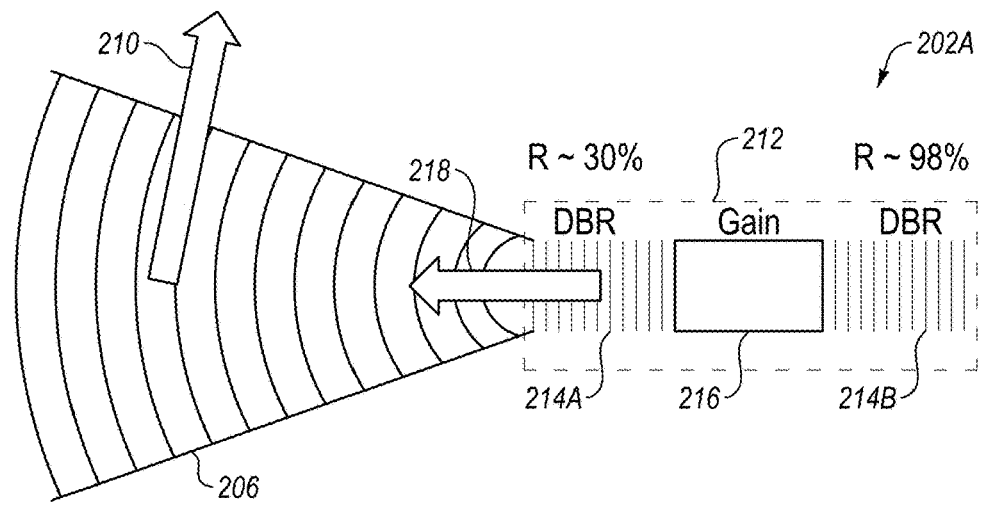
FIGS. 2A and 2B illustrate an example grating coupled laser that may be implemented in a surface coupled system.
Figure 2B:
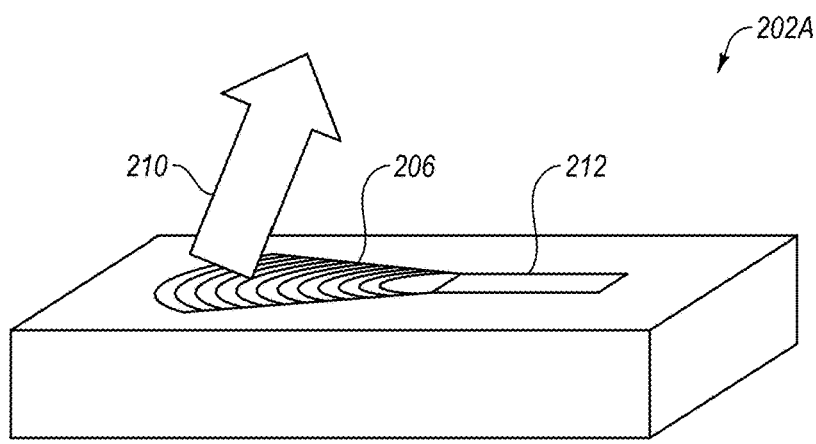
Figure 2C:
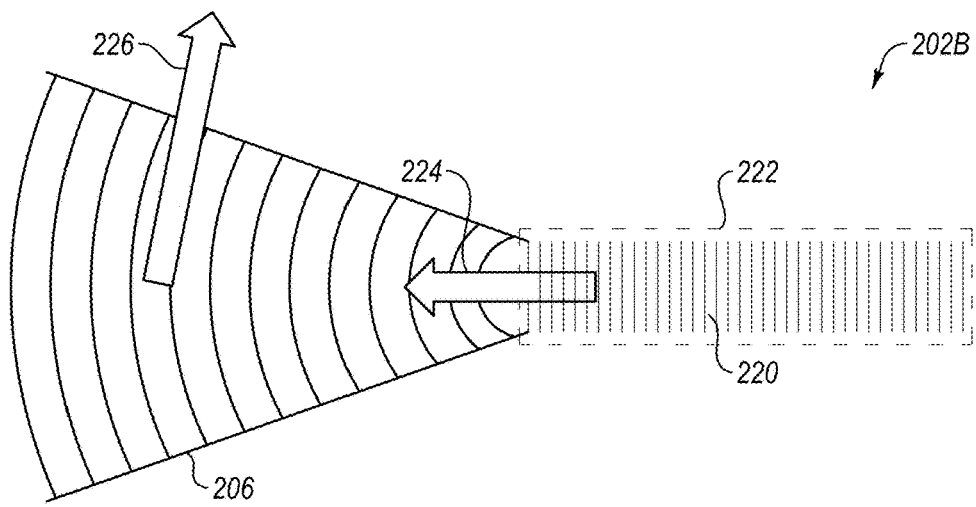
FIG. 2C illustrates another example grating coupled laser that may be implemented in a surface coupled system.

FIGS. 2A and 2B illustrate an example GCL laser 202A that may be implemented in a surface coupled system, such as the surface coupled system 100 discussed in relation to FIG. 1B and/or in other surface coupled system described herein. FIG. 2A includes a bottom view and FIG. 2B includes a bottom perspective view of the GCL laser 202A. FIG. 2C illustrates another example GCL laser 202B that may be implemented in a surface coupled system, such as the surface coupled system 100 discussed in relation to FIG. 1 and/or in other surface coupled systems described herein. Each of the lasers 202A and 202B may include or correspond to the GCL laser 102 of FIG. 1 or to other GCL lasers in other systems described herein.

Referring first to FIGS. 2A and 2B, the GCL laser 202A may include a gain medium 216, a first or front distributed Bragg reflector (DBR) 214A, and a second or rear DBR 214B. The first DBR 214A and the second DBR 214B together with the gain medium 216 may form a laser cavity 212 such that the GCL laser 202A in the example of FIGS. 2A and 2B may include a DBR laser. Alternatively or additionally, and as illustrated in FIG. 2C, the GCL laser 202B may include a distributed feedback (DFB) laser in which a grating 220 and gain medium 222 overlap in the laser cavity. In other embodiments, a DFB type gain region (as in FIG. 2C) and one or more passive DBR regions (as in FIG. 2A) may both be present to provide feedback in a configuration which may be termed a Distributed Reflector (DR) laser, and which may be used for high speed laser applications. Each of the GCL lasers 202A, 202B may include a transmit grating coupler 206 optically coupled to the corresponding laser cavity (e.g., 212 in FIGS. 2A and 2B). The transmit grating coupler 206 may be similar or identical to the transmit grating coupler 106 discussed in relation to FIG. 1 or to other transmit grating couplers discussed herein. A fan out region of the transmit grating coupler 206 may include grating lines such that the transmit grating coupler 206 and the fan out region partially or completely overlap.

In FIGS. 2A and 2B, a reflectance of the second DBR 214B may be about 98 percent and a reflectance of the first DBR 214A may be about 30 percent. In other embodiments, the first DBR 214A and the second DBR 214B may have other reflectance values.

In FIGS. 2A and 2B, the GCL laser 202A may generally emit light 218 through the first DBR 214A toward the transmit grating coupler 206. The emitted light 218 may interact with the transmit grating coupler 206 to be diffracted by the transmit grating coupler 206 as diffracted light 210.

In FIG. 2C, the GCL laser 202B implemented as a DFB laser may generally emit light 224 through a front (e.g., a cleaved facet with an AR coating) of the DFB laser toward the transmit grating coupler 206. The light 224 may interact with the transmit grating coupler 206 to be diffracted by the transmit grating coupler 206 as diffracted light 226.

The GCL laser 202A and/or 202B may be hermetically sealed by a passivation layer formed by SiN or silicon oxide ($SiO_x$) deposition on the GCL laser 202A or 202B. For example, one or more layers of SiN and/or $SiO_x$ may be deposited over the GCL laser 202A or 202B to hermetically seal the GCL laser 202A or 202B.

Grating couplers, such as the grating coupler 10 of FIG. 1A and the transmit grating couplers 106, 206 and the receive grating coupler 108 of FIGS. 1B-2C may have a variety of parameters, some of which will now be discussed. In general, grating couplers may include a periodic structure in which, e.g., index of refraction periodically alternates by providing repeated alternating regions, some of which have a first index of refraction and others of which have a second index of refraction. A difference between the first index of refraction and the second index of refraction may be referred to as index contrast Δn of the grating coupler. A length of the periodic structure in a light propagation direction may be referred to as a length L of the grating coupler. Kappa, or K, may describe a depth of the grating coupler or of a corrugation included in the periodic structure, where depth is measured in a direction that is both orthogonal to the light propagation direction and orthogonal to the lateral expansion direction.

Si grating couplers such as may be implemented as the receive grating coupler 108 in FIG. 1B may have an index contrast Δn of about 2 and a length L of 10-20 μm designed for far field emission into about a 10 μm fiber mode over about a 30 nanometer (nm) bandwidth. An InP grating coupler such as may be formed as the transmit grating couplers 106, 206 in the GCL lasers 102, 202A, 202B of FIGS. 1B-2C may have an index contrast Δn of about 1.5-2 with a length L of about 30-50 μm to achieve>90% coupling efficiency. The length L of the InP grating coupler may be much longer than the length L of the Si grating coupler in this example to generate a relatively large spot size of 20-30 μm. In other embodiments, the length L of the InP grating coupler and of the Si grating coupler may be the same or about the same. In some embodiments, the bandwidth of the InP grating coupler may only need to be a minimum of about 4 nm if centered on a nominal center wavelength of the corresponding GCL laser to allow for difference in temperature of a DFB grating included in the laser and that of the InP grating coupler. As temperature increases, an effective index of InGaAsP/InP gain material changes and shifts the DFB grating to longer wavelength. Thus, the InP grating coupler may be at nearly the same temperature as the gain material and therefore may move in the same direction and by nearly the same amount.

The Si grating coupler may be designed to match a mode profile generated by the InP grating coupler. Alternatively, the PIC may include a SiN grating coupler implemented as the receive grating coupler. SiN grating couplers may have smaller index contrast Δn than Si grating couplers. As such, a mode profile of such a SiN grating coupler may better match the mode profile of the InP grating coupler.

The coupling efficiency for a Si grating coupler with an index contrast Δn about equal to 2 and a length L between 10-20 μm may be between 0.8 to 2 decibels (dB). A Si grating coupler with a smaller index contrast Δn and/or a longer length L may have better coupling efficiency than 0.8 to 2 dB. In some embodiments, the length L of the Si grating coupler (or other receive grating coupler) may be extended to match or substantially match the length L of the InP grating coupler (or other transmit grating coupler).

In some embodiments, the periodic structure of one or more of the grating couplers described herein may include corrugations or teeth. The corrugations or teeth may be partially etched to improve directionality of light diffracted by the grating coupler.

Figure 3:
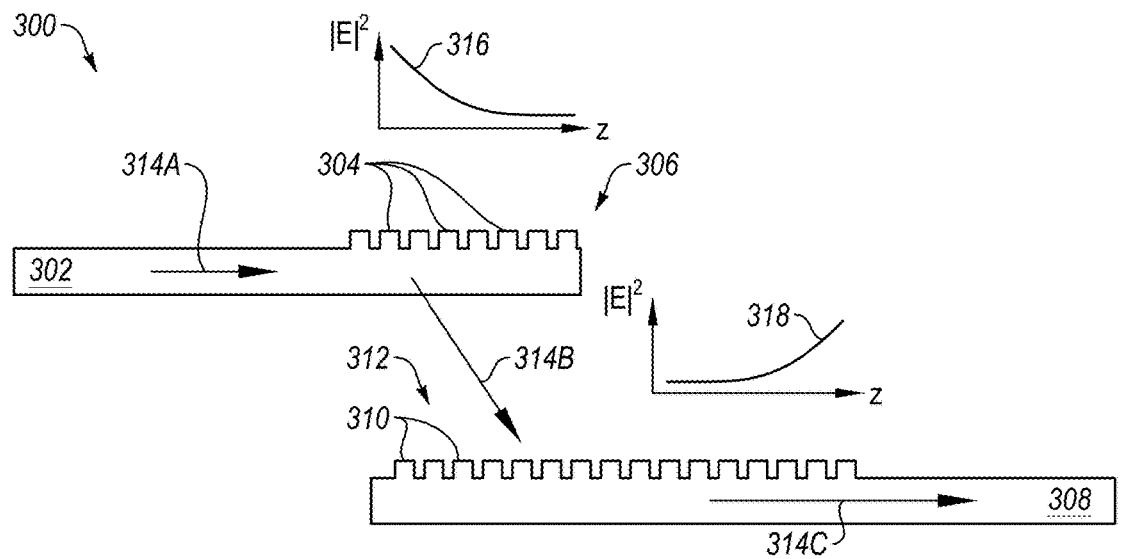
FIG. 3 illustrates portions of another example surface coupled system.

FIG. 3 illustrates portions of another example surface coupled system 300, arranged in accordance with at least one embodiment described herein. The surface coupled system 300 of FIG. 3 includes a first waveguide core 302 and transmit grating teeth 304 (only some of which are labeled for simplicity) of a transmit grating coupler 306 as well as a second waveguide core 308 and receive grating teeth 310 (only some of which are labeled for simplicity) of a receive grating coupler 312. The transmit grating teeth 304 are formed on the first waveguide core 302 and may alternate with top cladding teeth (not shown in FIG. 3) of a top cladding (not shown in FIG. 3), which top cladding teeth may be formed or otherwise disposed in the gaps between the transmit grating teeth 304. Similarly, the receive grating teeth 310 are formed on the second waveguide core 308 and may alternate with top cladding teeth (not shown in FIG. 3) of a top cladding (not shown in FIG. 3), which top cladding teeth may be formed or otherwise disposed in the gaps between the receive grating teeth 310. In some embodiments, the top cladding and top cladding teeth for either or both of the transmit and receive grating couplers 306, 312 may include a dielectric, such as SiO$_2$, air, or other suitable material.

In the example of FIG. 3, the receive grating coupler 312 is a positive angle grating coupler. FIG. 3 additionally illustrates light propagation directions 314A, 314B, and 314C at various locations in the surface coupled system 300. As used herein, a positive angle grating coupler is a surface grating coupler in which the light propagation direction 314A, 314C in the corresponding waveguide 302, 308 is in the same direction as a lateral component of the light propagation direction 314B of light traveling between the two grating couplers. For instance, in FIG. 3, light that is incident on the receive grating coupler 312 travels in the light propagation direction 314B that has a lateral component to the right and, after being coupled into the second waveguide 308 in FIG. 3, the light travels in the light propagation direction 314C that is also to the right.

FIG. 3 additionally illustrates a simplified simulated electric field radiation profile 316, 318 for each of, respectively, the transmit grating coupler 306 and the receive grating coupler 312. In FIG. 3, the electric field radiation profiles 316, 318 of the transmit grating coupler 306 and the receive grating coupler 312 are both generally exponential but in opposite directions. Thus, as can be seen from the electric field radiation profile 316 of the transmit grating coupler 306, light diffracted downward by the transmit grating coupler 306 has a much higher intensity at the beginning (e.g., left side in FIG. 3) of the transmit grating coupler 306, which intensity generally decays exponentially to the right in FIG. 3. In comparison, and as can be seen from the electric field radiation profile 318 of the receive grating coupler 312, light coupled into the receive grating coupler 312 has a relatively low intensity at the beginning (e.g., left side in FIG. 3) of the receive grating coupler 312, which intensity generally increases exponentially to the right in FIG. 3. The opposite electric field radiation profiles 316, 318 may complicate apodization procedures of the transmit and receive grating couplers 306, 312 for mode matching.

Figure 4:
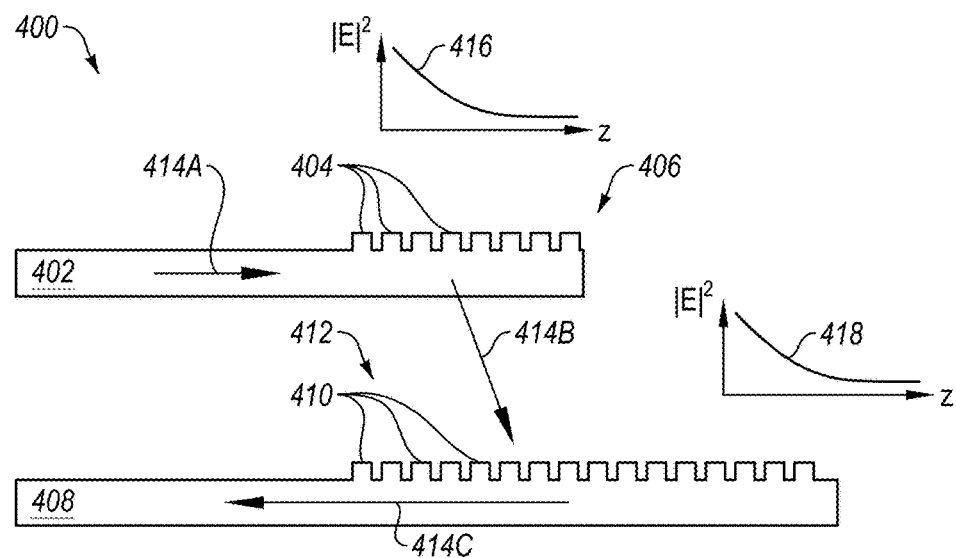
FIG. 4 illustrates portions of another example surface coupled system.

FIG. 4 illustrates portions of another example surface coupled system 400, arranged in accordance with at least one embodiment described herein. The surface coupled system 400 of FIG. 4 is similar in many ways to the surface coupled system 300 of FIG. 3. For instance, the surface coupled system 400 of FIG. 4 similarly includes a first waveguide core 402 and transmit grating teeth 404 (only some of which are labeled for simplicity) of a transmit grating coupler 406 as well as a second waveguide core 408 and receive grating teeth 410 (only some of which are labeled for simplicity) of a receive grating coupler 412. The transmit grating teeth 404 are formed on the first waveguide core 402 and may alternate with top cladding teeth (not shown in FIG. 3) of a top cladding (not shown in FIG. 3), which top cladding teeth may be formed or otherwise disposed in the gaps between the transmit grating teeth 404. Similarly, the receive grating teeth 410 are formed on the second waveguide core 408 and may alternate with top cladding teeth (not shown in FIG. 3) of a top cladding (not shown in FIG. 3), which top cladding teeth may be formed or otherwise disposed in the gaps between the receive grating teeth 410. In some embodiments, the top cladding and top cladding teeth for either or both of the transmit and receive grating couplers 406, 412 may include a dielectric, such as SiO$_2$, air, or other suitable material.

In the embodiment of FIG. 4, the receive grating coupler 412 is a negative angle grating coupler. FIG. 4 additionally illustrates light propagation directions 414A, 414B, and 414C at various locations in the surface coupled system 400. As used herein, a negative angle grating coupler is a surface grating coupler in which light propagation in the corresponding waveguide is in the opposite direction as a lateral component of the propagation direction of the incident light that is incident on the surface grating coupler. For instance, in FIG. 4, incident light that is incident on the receive grating coupler in the light propagation direction 414B has a lateral component to the right and, after being coupled into the second waveguide that includes the second waveguide core 408, the light propagates in the opposite direction, e.g., to the left, in the light propagation direction 414C. In comparison, light propagating in the first waveguide that includes the first waveguide core 402 propagates to the right according to the light propagation direction 414A, which is in the same direction as the lateral component of the light propagation direction 414B, such that transmit grating coupler 406 is a positive angle grating coupler.

FIG. 4 additionally illustrates a simplified electric field radiation profile 416, 418 for each of, respectively, the transmit grating coupler 406 and the receive grating coupler 412. In FIG. 4, the electric field radiation profiles 416, 418 of the transmit grating coupler 406 and the receive grating coupler 412 are both generally exponential and in the same direction. Thus, light diffracted downward by the transmit grating coupler 406 has a much higher intensity at the beginning (e.g., left side in FIG. 4) of the transmit grating coupler 406, which intensity generally decays exponentially to the right in FIG. 4. In comparison, light coupled into the receive grating coupler 412 has a relatively low intensity at the right in FIG. 4, which intensity generally increases exponentially to the left in FIG. 4. The same or similar electric field radiation profiles 416, 418 may simplify apodization procedures of the transmit and receive grating couplers 406, 412 of FIG. 4 for mode matching as compared to the embodiment of FIG. 3.

In addition, the negative angle of the receive grating coupler 412 may reduce high order scattering directions to improve coupling efficiency in the fundamental order. In an example implementation using SiN as the second waveguide core 408 and receive grating teeth 410 in the receive grating coupler 412, the coupling efficiency may be improved by about 1-2 dB compared to the positive angle configuration of FIG. 3.

Figure 5:
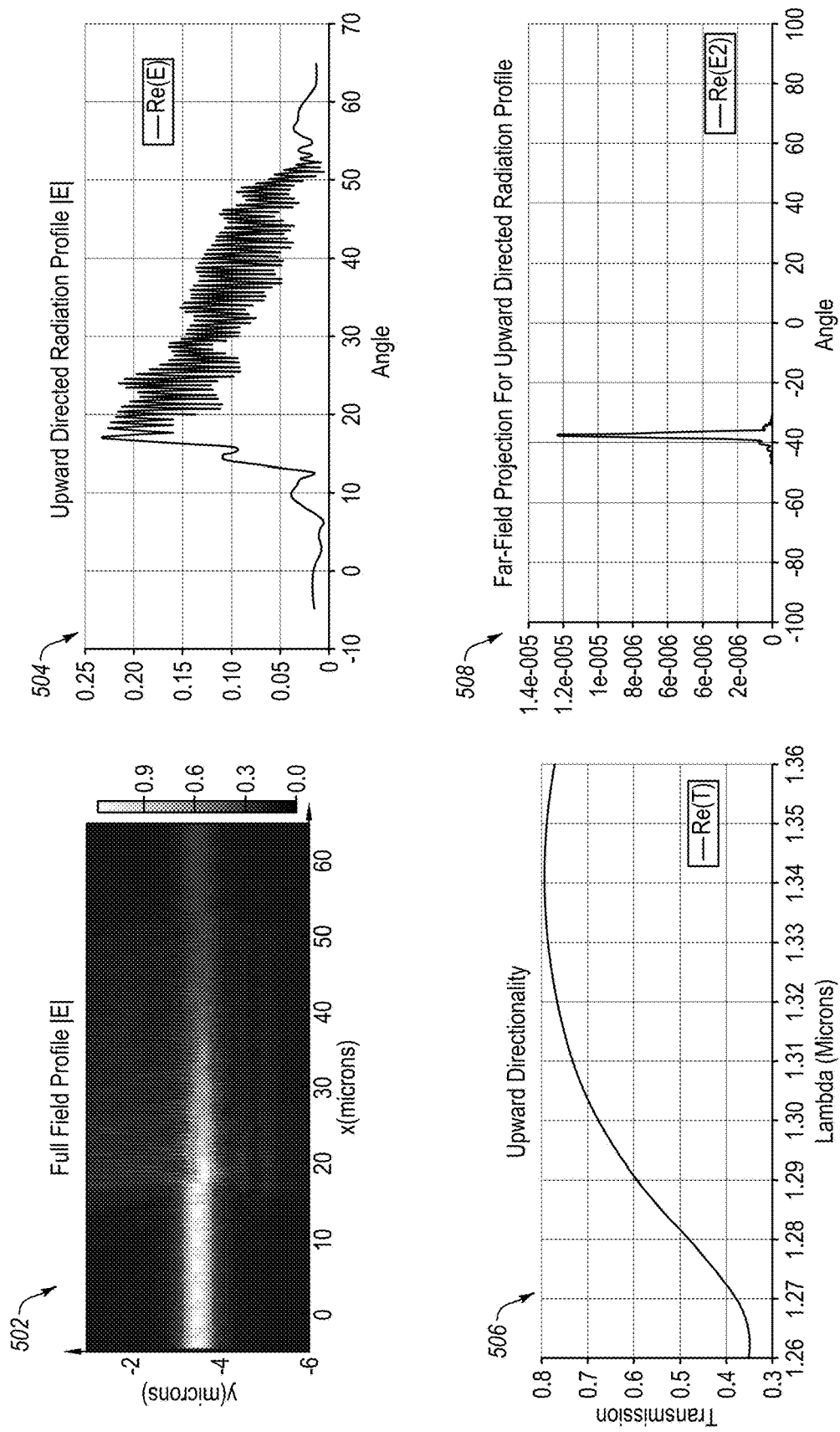
FIG. 5 illustrates various simulations for a receive grating coupler included in the surface coupled system of FIG. 4,
all arranged in accordance with at least one embodiment described herein.

FIG. 5 illustrates various simulations 502, 504, 506, 508 for the receive grating coupler 412 of FIG. 4, arranged in accordance with at least one embodiment described herein. In more detail, the simulation 502 illustrates a simulated cross section full E field along a center of the receive grating coupler 412. The simulation 504 illustrates a simulated upward directed radiation E field of the receive grating coupler 412. The simulation 506 illustrates a simulated upward directionality of the receive grating coupler 412. The simulation 508 illustrates a simulated far field projection for upward directed radiation profile of the receive grating coupler 412. In the simulations of FIG. 5, the receive grating coupler 406 is determined to have maximum upward directionality of −1.35 dB and an emission angle of −37.56 degrees.

Table 1 below includes various example parameters for the surface coupled system 400 of FIG. 4 that may have improved coupling efficiency.

TABLE 1

| Parameter | Example Value |
| --- | --- |
| Transmit Grating Coupler Period | 543.6 nm |
| Transmit Grating Coupler Duty Cycle | 0.3505 |
| Transmit Grating Coupler Tooth Height | 679.5 nm |

TABLE 1-continued

| Parameter | Example Value |
| --- | --- |
| Anti Reflection (AR) Layer Thickness | 1027 nm |
| Receive Grating Coupler Period | 508.4 nm |
| Receive Grating Coupler Duty Cycle | 0.6439 |
| Receive Grating Coupler Partial Etch Slab Thickness | 256.5 nm |

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
 a grating coupled laser comprising a first waveguide and a transmit grating coupler optically coupled to the first waveguide; and
 a photonic integrated circuit (PIC) comprising a second waveguide and a receive grating coupler optically coupled to the second waveguide, wherein:
  the receive grating coupler comprises a negative angle grating coupler;
  a first electric field radiation profile of the transmit grating coupler and a second electric field radiation profile of the receive grating coupler are both generally exponential and in a same direction; and
  the second electric field radiation profile of the receive grating coupler generally decays exponentially in a direction parallel to the receive grating coupler.

2. The system of claim 1, wherein the negative angle grating coupler comprises a surface grating coupler in which a light propagation direction of incident light incident on the negative angle grating coupler has a lateral component in an opposite direction as light propagation in the second waveguide.

3. The system of claim 1, wherein:
 the grating coupled laser comprises an indium phosphide (InP) grating coupled laser; and
 the PIC comprises a silicon (Si) PIC.

4. The system of claim 3, wherein the negative angle grating coupler comprises a silicon nitride (SiN) grating coupler and wherein the negative angle grating coupler includes alternating receive grating teeth and top cladding teeth with a constant receive grating period in a range from 400 to 700 nanometers (nm).

5. The system of claim 4, wherein the receive grating teeth have a receive grating duty cycle in a range from 0.2 to 0.9.

6. The system of claim 4, wherein the receive grating teeth extend from a partial etch slab, the partial etch slab having a thickness in a range from 240 to 350 nm.

7. The system of claim 1, wherein the transmit grating coupler includes alternating transmit grating teeth and top cladding teeth with a constant transmit grating period in a range from 400 to 700 nanometers (nm).

8. The system of claim 7, wherein the transmit grating teeth have a transmit grating duty cycle in a range from 0.20 to 0.9.

9. A system comprising:
a grating coupled laser comprising a first waveguide and a transmit grating coupler optically coupled to the first waveguide; and
a photonic integrated circuit (PIC) comprising a second waveguide and a receive grating coupler optically coupled to the second waveguide, wherein:
the receive grating coupler of the PIC is optically coupled to the transmit grating coupler of the grating coupled laser; and
a first electric field radiation profile of the transmit grating coupler and a second electric field radiation profile of the receive grating coupler are both generally exponential and in a same direction.

10. The system of claim 9, wherein the receive grating coupler comprises a negative angle grating coupler in which a light propagation direction of incident light incident on the negative angle grating coupler has a lateral component in an opposite direction as light propagation in the second waveguide.

11. The system of claim 9, wherein:
the grating coupled laser comprises an indium phosphide (InP) grating coupled laser; and
the PIC comprises a silicon (Si) PIC.

12. The system of claim 11, wherein the receive grating coupler comprises a silicon nitride (SiN) grating coupler and wherein the receive grating coupler includes alternating receive grating teeth and top cladding teeth with a constant receive grating period in a range from 400 to 700 nanometers (nm).

13. The system of claim 12, wherein the receive grating teeth have a receive grating duty cycle in a range from 0.2 to 0.9.

14. The system of claim 12, wherein the receive grating teeth extend from a partial etch slab, the partial etch slab having a thickness in a range from 240 to 350 nm.

15. The system of claim 9, wherein the transmit grating coupler includes alternating transmit grating teeth and top cladding teeth with a constant transmit grating period in a range from 400 to 700 nanometers (nm).

16. The system of claim 15, wherein the transmit grating teeth have a transmit grating duty cycle in a range from 0.2 to 0.9.

17. A photonic integrated circuit (PIC), comprising:
a waveguide;
a receive grating coupler optically coupled to the waveguide, the receive grating coupler comprising a partial etch slab optically coupled with the waveguide and a plurality of grating teeth that extend from the partial etch slab; and
a top cladding that covers the waveguide and the receive grating coupler and fills in gaps between the plurality of grating teeth, wherein:
the waveguide extends from the receive grating coupler in a first direction;
the receive grating coupler comprises a negative angle grating coupler in which:
incident light on the receive grating coupler has a lateral component parallel to the waveguide and in a second direction opposite the first direction; and
the light is coupled into the waveguide by the receive grating coupler to propagate in the waveguide in the first direction that is opposite the second direction of the lateral component; and
the light is coupled by the receive grating coupler into the waveguide with an intensity that generally increases exponentially in the first direction across the receive grating coupler.

18. The PIC of claim 17, wherein one of:
the negative angle grating coupler comprises a silicon nitride (SiN) grating coupler and the plurality of grating teeth comprise SiN receive grating teeth, the SiN receive grating teeth alternating with top cladding teeth that fill in the gaps, the SiN receive grating teeth having a constant receive grating period in a range of 400 to 700 nanometers (nm); or
the negative angle grating coupler comprises a Si grating coupler and the plurality of grating teeth comprise Si receive grating teeth, the Si receive grating teeth alternating with top cladding teeth that fill in the gaps, the Si receive grating teeth having a constant receive grating period in a range from 200 to 600 nm.

19. The PIC of claim 18, wherein the Si or SiN receive grating teeth have a receive grating duty cycle in a range from 0.2 to 0.9.

20. The PIC of claim 18, wherein the partial etch slab comprises a Si or SiN partial etch slab from the which the Si or SiN receive grating teeth extend, the Si or SiN partial etch slab having a thickness in a range from 240 to 350 nm.

* * * * *